US010242562B2

(12) United States Patent
Steinmetz

(10) Patent No.: US 10,242,562 B2
(45) Date of Patent: Mar. 26, 2019

(54) CONTROL SYSTEMS WITH MODULAR CONFIGURABLE DEVICES

(71) Applicant: Jay Steinmetz, Baltimore, MD (US)

(72) Inventor: Jay Steinmetz, Baltimore, MD (US)

(73) Assignee: Thames Technology Holdings, Inc., Baltimore, MD (US)

( * ) Notice: Subject to any disclaimer, the term of this patent is extended or adjusted under 35 U.S.C. 154(b) by 0 days.

(21) Appl. No.: 15/439,098

(22) Filed: Feb. 22, 2017

(65) Prior Publication Data

US 2018/0240329 A1 Aug. 23, 2018

(51) Int. Cl.
  *G08C 17/02* (2006.01)
  *H05K 5/00* (2006.01)
  *H05K 5/02* (2006.01)
  *H04W 4/80* (2018.01)

(52) U.S. Cl.
  CPC .............. *G08C 17/02* (2013.01); *H04W 4/80* (2018.02); *H05K 5/0017* (2013.01); *H05K 5/0256* (2013.01); *G08C 2201/112* (2013.01); *G08C 2201/20* (2013.01); *G08C 2201/30* (2013.01)

(58) Field of Classification Search
  None
  See application file for complete search history.

(56) References Cited

U.S. PATENT DOCUMENTS

| | | | | |
|---|---|---|---|---|
| 6,097,520 A | * | 8/2000 | Kadnier ................. | G08C 19/28 348/734 |
| 2014/0267034 A1 | * | 9/2014 | Krulce .................... | G06F 3/013 345/158 |
| 2015/0254199 A1 | * | 9/2015 | Sullivan ................ | G06F 13/385 710/12 |
| 2016/0189520 A1 | * | 6/2016 | Papageorge ........... | G08B 21/12 340/632 |
| 2016/0255301 A1 | * | 9/2016 | Vadura ................... | H04N 5/655 348/839 |
| 2017/0086044 A1 | * | 3/2017 | Spina ....................... | H04W 4/21 |
| 2017/0133953 A1 | * | 5/2017 | Gross ..................... | H02N 2/181 |

* cited by examiner

*Primary Examiner* — Leon Viet Q Nguyen
(74) *Attorney, Agent, or Firm* — Occhiuti & Rohlicek LLP

(57) ABSTRACT

Disclosed are devices, systems, apparatus, methods, products, and other implementations, including a control system that includes a receiving structure to receive a plurality of modular devices, with one or more of the plurality of modular devices being coupled into respective locations on the receiving structure and with each of the one or more of the plurality of modular devices configured to transmit a short-range communication in response to receiving a respective stimulus by the each of the one or more of the plurality of modular devices. The control system further includes a communication module to communicate with the one or more of the plurality of modular devices coupled to the receiving structure, and a controller configured to perform a respective operation in response to receiving a short-range message from a respective one of the one or more of the plurality of modular devices.

19 Claims, 4 Drawing Sheets

CONTROL SYSTEMS WITH MODULAR CONFIGURABLE DEVICES

BACKGROUND

User interface devices, including control panels to operate various systems and machineries (e.g., vehicles such as forklifts) and control their functionality, generally include user-actuatable implements (e.g., keyboard buttons) and other input/output devices that facilitate interaction with the environment of the particular system or machinery. Often, the system or machinery to be controlled are configured, or are used for, specific functionality, rendering at least some of the user-actuatable implements and other input/output device fitted on a standard-issue user interface device unneeded. The availability of more user-actuatable implements and other input/output devices on a standard-issue user interface device than are needed for operation of the particular system or machinery may result in unnecessary complexity to the operation of the system or machinery by users. This can result in longer training times for the user to learn how to use the system or machinery, and can also increase the likelihood of an accident occurring (e.g., due to decision-making delay in locating a particular button or implement on the user-interface, or pressing a wrong button).

SUMMARY

The devices, methods, products, systems, apparatus, and other implementations described herein include a control system comprising a receiving structure to receive a plurality of modular devices, with one or more of the plurality of modular devices being coupled into respective locations on the receiving structure and with each of the one or more of the plurality of modular devices configured to transmit a short-range communication in response to receiving a respective stimulus by the each of the one or more of the plurality of modular devices. The control system further includes a communication module to communicate with the one or more of the plurality of modular devices coupled to the receiving structure, and a controller configured to perform a respective operation in response to receiving a short-range message from a respective one of the one or more of the plurality of modular devices.

Embodiments of the control system may include at least some of the features described in the present disclosure, including one or more of the following features.

The short-range message transmitted by a respective one of the one or more of the plurality of the devices may include an identifier associated with the respective one of the one or more of the plurality of modular devices, and stimulus data representative of the respective stimulus received by the respective one of the one or more of the plurality of the modular devices. The controller is configured to identify the identifier associated with the respective one of the one or more of the plurality of modular devices.

The controller configured to perform the respective operation may be configured to perform one or more modifiable operations in response to receiving the short-range message communication from the respective one of the one or more of the plurality of modular devices.

At least one of the one or more of the plurality of modular devices may include an energy harvesting module including at least one of: an inductive power-harvesting unit, or a piezo-electric-based energy harvesting unit.

The each of the one or more of the plurality of modular devices configured to transmit the short-range communication may be configured to transmit one or more of, for example, an inductive-based electromagnetic transmission, an RFID-based transmission, a Bluetooth transmission, a Bluetooth-Low-Energy transmission, and/or a WiFi transmission.

At least one of the one or more of the plurality of modular devices may be mechanically slidable into tracks defined in the receiving structure of the control system.

At least one of the one or more of the plurality of modular devices may be magnetically mountable to the receiving structure of the control system.

At least one of the one or more of the plurality of modular devices may include an actuatable keyboard button configured to transmit a corresponding short-range communication in response to actuation of the actuatable keyboard button.

At least one of the one or more of the plurality of modular devices may include a sensor configured to measure stimulus data. The sensor may include a gas sensor configured to detect one or more gases in an area in which the control system is located.

The sensor may include an optical sensor to capture optical data from a direction opposite a side of the control system comprising a display surface, and the controller may be configured to determine, based on the optical data captured by the optical sensor, whether at least some of the optical data corresponds to features of an eye of a user facing the side of the control system comprising the display surface. The controller may be configured to control activation state of the display surface of the control system based on a determination of whether the at least some of the optical data captured by the optical sensor corresponds to the features of the eye of the user using the control system.

The sensor may include a biometric sensor to measure biometric data for a user of the control system. The controller may be configured to control operation of the control system based, at least in part, on the measured biometric data for the user.

In some variations, a method is provided that includes coupling one or more modular devices to a receiving structure of a control system comprising a controller, with the one or more modular devices being configured to transmit short-range communications in response to receiving respective stimuli. The method further includes configuring the control system to perform respective operations responsive to the short-range communications received from the respective one or more modular devices coupled to the receiving structure of the control system, receiving from one of the one or more modular devices a short-range communication responsive to receipt of a stimulus by the one of the one or more modular devices coupled to the receiving structure of the control system, and performing, in response to receipt of the short-range communication from the one of the one or more modular devices, the respective operation the control system is configured to perform in response to receipt of communications from the one of the one or more modular devices coupled to the receiving structure of the control system.

Embodiments of the method may include at least some of the features described in the present disclosure, including any of the features described above in relation to the control system, as well as one or more of the following features.

Coupling the one or more modular devices to the receiving structure may include, for example, slidably fitting at least one of the one or more modular devices into tracks defined in the receiving structure of the control system, and/or magnetically mounting the at least one of the one or more modular devices to the receiving structure of the control system.

Receiving from the one of the one or more modular devices the short-range communication responsive to receipt of the stimulus by the one of the one or more modular devices coupled to the receiving structure of the control system may include receiving an identifier associated with the one of the one or more modular devices, and stimulus data representative of the respective stimulus received by the one of the one or more modular devices, with the identifier and the stimulus data being included with the short-range communication received by the control system, and determining the identifier associated with the one or more of the plurality of modular devices.

Coupling the one or more modular devices to the receiving structure of the control system may include one or more of, for example, coupling to the receiving structure at least one modular actuatable button configured to transmit a corresponding short-range communication in response to actuation of the at least one modular actuatable button, or coupling to the receiving structure at least one modular sensor configured to measure stimulus data and to transmit the measured stimulus data in another short-range communication.

Coupling to the receiving structure the at least one modular sensor may include coupling to the receiving structure at least one gas sensor configured to detect one or more gases in an area in which the control system is located.

Coupling to the receiving structure the at least one modular sensor may include coupling to the receiving structure at least one optical sensor to receive optical data from a direction opposite a side of the control system comprising a display surface of the control system. The method may further include determining, based on the optical data received from the optical sensor, whether at least some of the optical data correspond to features of an eye of a user facing the side of the control system comprising the display surface.

Configuring the control system to perform the respective operations responsive to the communications received from the respective one or more modular devices coupled to the receiving structure of the control system may include selecting one of a plurality of operations performable by the control system, and assigning the selected one of the plurality of operations to be associated with communications received from a selected one of the one or more modular devices coupled to the receiving structure of the control system.

In some variations, a modular device is provided that includes a housing fittable on a receiving structure of a control system configured to receive a plurality of modular devices, a detector configured to receive a stimulus, and a communication module to transmit a short-range message to the control system in response to receiving the stimulus, with the control system being adapted to perform a modifiable operation in response to receiving the short-range message from the modular device.

Embodiments of the modular device may include at least some of the features described in the present disclosure, including any of the features described above in relation to the control system and the method.

Details of one or more implementations are set forth in the accompanying drawings and in the description below. Further features, aspects, and advantages will become apparent from the description, the drawings, and the claims.

BRIEF DESCRIPTION OF THE DRAWINGS

These and other aspects will now be described in detail with reference to the following drawings.

Like reference symbols in the various drawings indicate like elements.

DETAILED DESCRIPTION

Figure 1:
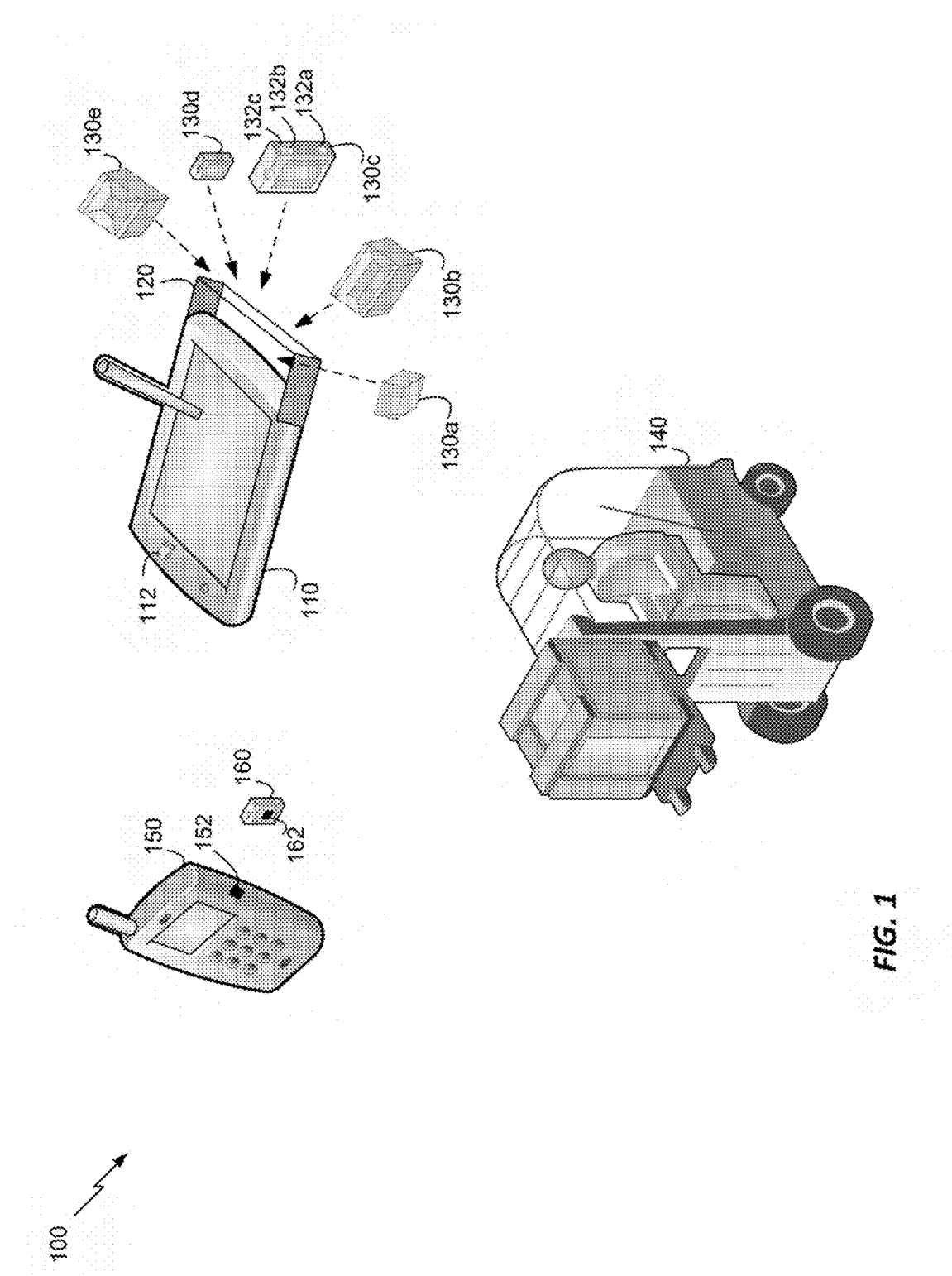
FIG. 1 is a diagram of an example system that uses one or more modular devices in conjunction with a controller (control device).

Disclosed herein are systems, devices, methods, and other implementations that include a control system (e.g., a computer-based control system, which, in some embodiments, may be a vehicle-mounted control system) comprising a receiving structure to receive a plurality of modular devices (e.g., mechanical tracks coupled to a tablet-like device into which modular devices, like modular keyboard buttons or modular sensors, can be fitted and secured via mechanical or electro-magnetic means). The control system further includes one or more of the plurality of modular devices coupled into respective locations on the receiving structure (i.e., the receiving structure can be fitted with as many of the modular devices as are needed, which may be fewer than the available space for fitting the plurality of modular devices), with each of the one or more of the plurality of modular devices (fitted onto the receiving structure) configured to transmit a respective short-range communication in response to receiving a respective stimulus by the each of the one or more of the plurality of modular devices. The control system further includes a communication module (e.g., a short-range transceiver, a wired communication interface, etc.) configured to communicate with the one or more of the plurality of modular devices coupled to the receiving structure, and a controller (e.g., processor-based controller) configured to perform a respective operation in response to receiving a short-range message from a respective one of one or more of the plurality of modular devices. In some embodiments, the controller configured to perform the respective operation may be configured to perform one or more modifiable operations in response to receiving the short-range message communication from the respective one of one or more of the plurality of modular devices (i.e., the particular operation caused as result of the receipt of the short-range message can be occasionally changed, and thus the control system can be configured to perform operations corresponding to the specific needs of the user configuring the control system). In some embodiments, at least one of the one or more of the plurality of the modular devices may include, for example, an actuatable keyboard button (e.g., a plastic or rubber-based button) configured to transmit a corresponding short-range communication in response to actuation of the actuatable keyboard button, a sensor configured to measure stimulus data (e.g., a gas sensor configured to detect one or more gases in an area in which the control system is located, an optical sensor, and so on), etc.

Thus, suppose, for example, that a control system to control operation of a forklift is to be realized. In such an example, a vehicle-mounted tablet with a receiving structure (e.g., tracks) is provided that can receive mechanically securable, or magnetically securable, buttons or other implements (a modular device may include mechanical projections/ribs placed on a housing of the modular device, that can be fitted into the tracks of the receiving structure). An appropriate size modular device may be selected from a repertoire of different size modular devices (e.g., with modular devices with larger surface areas being designated for more important configurable functions since they will be more prominently available on the configurable tablet). The selected modular device may be assigned, or may have been assigned, a unique identifier that will be transmitted to the communication module of the tablet device when the selected modular device is responding to some stimulus (e.g., detection of toxic gas, detection of mechanical actuation of the modular device, etc.) In situations where the selected modular device has a previously assigned identifier, that identifier may be retrieved through a barcode placed on the housing of the modular device, or by receiving a wireless communication (e.g., an RFID-based communication) from the modular device that includes the unique identifier assigned to it (the unique identifier may be stored in a non-volatile memory device within the housing of the modular device). During calibration/preparation of the tablet device (or whichever type of control device is being used), the tablet device may be configured to perform specific operations (e.g., generate control signals that can be provided to various electro-mechanical parts of the system or machinery controlled by the tablet device) in response to receiving a message that includes the unique identifier from the selected modular device. For example, the selected modular device may be designated to control upwards actuation of a mast of a forklift. Accordingly, the control system may execute an application or process that guides a user in matching or pairing the selected modular device to the operation of the particular system or machinery. The application or process may have been provided by the manufacturer of the system or machinery, and allows for the matching/pairing of unique identifiers (and other message content) to generation or suppression of control signaling controlling one or more of the sub-systems of the particular system/machinery).

With reference now to FIG. 1, a diagram of an example system 100 that uses one or more modular devices in conjunction with a controller (also referred to as a control device) is shown. The system 100 includes a controller 110 (in this case a processor-based tablet device, although any other portable/mobile device, such as a mobile smartphone 150 depicted in FIG. 1, or a non-portable device, may be used) that includes, or is coupled to, a receiving structure 120 (e.g., a mechanical frame fitted on the controller 110) configured to receive one or more of a plurality of modular devices 130a-e. The controller 110 may be any device configured to manage or control at least some operations that are to be performed in response to actuation of one or more of the modular devices that are to be fitted with the system. The controller (e.g., the tablet 110 or the mobile phone 150) may be retro-fitted with the receiving structure to receive one or more modules for enhanced operability of the controller. Alternatively, the controller (such as the tablet-type controller 110) may be produced/manufactured with a receiving structure or mechanism already coupled to the controller. In such embodiments, a portion of the surface area of the housing of the controller may be dedicated to receiving the multiple modular devices in order to facilitate realizing a controller with a user-selected custom-made user-interface. The receiving structure and/or the remainder of a housing for the controller 110 may be manufactured using, or may otherwise include, an ionic static material configured to resist/repel contaminants from accumulating on the material. In some embodiments, one or more modular devices may be secured to the controller (or a receiving structure therefor) via pegs or notches, such as a peg 112 illustrated in FIG. 1, provided on the housing of the controller or the receiving structure. The pegs so provided are configured to be fitted into corresponding openings defined in housings of modular devices (e.g., in a Lego-like manner). The pegs thus provide a mechanical attachment mechanism to secure modular devices to the controller, and thereafter the modular devices may wirelessly communicate with the controller (e.g., based on inductive wireless communication or any appropriate communication protocol).

The tablet-type controller 110 may be a vehicle-mounted tablet device that can be used to interface and control operation of a vehicle (such as a forklift 140 depicted in FIG. 1) or some other system or machinery. In that example, at least a portion of the top surface area of the tablet may include a receiving structure to receive user-selected modular devices to control the various functions of the forklift 140, with part of the top surface area being reserved for a display/screen to provide output to the user.

In some embodiments, the controller may be a non-portable device, such as a user interface (touch-based, mechanical-button-based) that is directly attached to (integrated) to the structure of the machinery or system that the controller is to control (e.g., the controller's interface portion may be attached directly to a front/dashboard of the forklift 140 of FIG. 1). As will be discussed in greater detail below, the controller can be configured, through a calibration or set-up process, to cause operations (generating control signals, commands, API calls, or any other controllable function) in response to input received from one or more of the modular devices. For example, a mechanical-actuator-type modular device (such as the modular buttons 130b and 130e) may provide the controller with a signal (e.g., wireless or wired signal) in response to be the button being depressed. In response to receiving the resultant signal from that modular device (via a communication module, which may be a wired interface or a wireless transceiver), the controller may be configured to cause a resulting operation (e.g., terminate power to the system or machinery being controlled if a button, configured to be an emergency power shutdown, is depressed, or if a particular sensor detects a dangerous condition such as the presence of a toxic gas). Thus, in some embodiments, a control system may include a receiving structure to receive a plurality of modular devices, with one or more of the plurality of modular devices coupled into respective locations on the receiving structure, and with each of the one or more of the plurality of modular devices configured to transmit a short-range communication in response to receiving a respective stimulus. In such embodiments, the control system may also include a communication module to communicate with the one or more of the plurality of modular devices coupled to the receiving structure, and a controller configured to perform a respective operation in response to receiving a short-range message from a respective one of one or more of the plurality of modular devices.

As shown in FIG. 1, the receiving structure 120 of the system 100 may be a mechanical frame configured to receive modular devices via mechanical coupling (e.g., through tension forces resulting from snugly fitting the modular devices within spaces defined in the receiving structure 120, through other types of mechanical coupling mechanism such as latches, bolting, and so on). In some embodiments, the receiving structure may include rails/tracks into which at least a portion of the housings of the various modular devices can be slid through and secured to the receiving structure. In some embodiments, the modular devices may be magnetically secured to the receiving structure (via direct magnetic contact, or through magnetic suspension forces). For example, the smartphone device 150 shown in FIG. 1 may be fitted with one or more magnetic attachment devices (such as a magnet 152) configured to allow magnetic coupling to a magnet 162 of a modular device 160 (which may be similar to any one of the modular devices 130a-e, or may be some other modular device implementation). Other attachment mechanisms for quick coupling of modular devices to the controller (such as the tablet-based device 110 or a mobile phone device 150) may also be used. Furthermore, the receiving structure may include a mix of different attachment mechanisms to allow different modular devices, implemented with different attachment mechanisms (mechanical coupling, magnetic coupling, etc.), to be accommodated on the receiving structure of the control system.

As illustrated in FIG. 1, different types of modular devices, of different shapes and configurations, may be selected for inclusion with the control system 100 (e.g., by being secured to the receiving structure 120). Some of the modular devices, such as the modular device 130b or 130e, may include a mechanical actuatable implement (e.g., a depressible button) that receives user stimulus (i.e., a user depressing the button), and in response thereto causes communication of a signal to the controller 110. For example, as a result of the mechanical actuation of the button of the modular device 130b, a piezo-electric element may activated (excited) causing an electric current/voltage to be generated. That electric current or voltage, which may be modulated, or otherwise regulated, to generate signal data representative of an identifier associated with the modular device 130b, may be transmitted through a wired connection to the controller 110 (e.g., the modular device may include a port, similar to any of ports 132a-c of the modular device 130c, that form an electric connection with corresponding electrical pins at the controller 110 or at the receiving structure 120), or may be wirelessly transmitted. Another example of an actuatable modular device may be a touch-surface modular device (e.g., which may be structured in a manner similar to the modular device 130a), and may be configured to detect contact or touch from another object (e.g., finger of a user). In this example, a top surface of the cubical-shaped modular device 130a may include an electrical capacitive or inductive surface, and a capacitive or inductive sensor within the modular device 130a may be configured to measure changes to the electrical capacitance or inductiveness of the top surface of the modular surface 130a. Upon contact of another object with the top surface of the modular device 130a, the modular device may generate an electrical signal (e.g., modulated to include identifier data associated with the modular device 130 and/or other data) for communication to the controller 110. Thus, in some embodiments, a modular device is provided that includes a housing fittable on a receiving structure of a control system configured to receive a plurality of modular devices, a detector configured to receive a stimulus, and a communication module to transmit a short-range message to the control system in response to receiving the stimulus, with the control system being adapted to perform a configurable (modifiable) operation in response to receiving the short-range message from the modular device.

As noted, signal data generated by any of the modular devices may be transmitted through wireless communication using a wireless transmitter (which may be part of a wireless transceiver) included with the modular devices. For example, the signal data may be inductively transmitted from an inductive communication module (e.g., a coil-based antenna) and received by a corresponding receive antenna at the controller 110. In another example, at least one of the modular devices may be configured to transmit the signal data according to one or more short-range communication protocols such as RFID-based protocol (implemented in any appropriate frequency band, such as LF, UHF, etc.), a Bluetooth™ protocol, a Bluetooth-Low-Energy™ (BLE) protocol, near-filed protocols, etc.

In some embodiments, at least one of the various modular devices that are included with the controller 110 (e.g., via the receiving structure 120) may include modules/units that detect and respond to other types of stimulus or input. For example, modular devices such as the devices 130c-d (which are depicted as not including a depressible buttons) may be sensors configured to detect different properties relating to operation of the modular devices and/or the environment in which those modular devices are operating. For example, the sensors may include inertial/orientation sensors configured to measure data relating to motion and/or location of the sensors (and thus of the device to which they are attached). In another example, a sensor-type modular device may be configured to measure such data as the atmospheric content of the environment in which that modular device is placed. For instance, a modular sensor may be attached to the controller 110 to detect if certain toxic gases (carbon monoxide) are present, so as to issue appropriate alerts/alarms to the users of the control system (or of the machinery/system controlled by the controller 110). In another example, the sensor-type modular device may be a biometric sensor to receive biometric data from a user (e.g., the user operating the control system). Examples of biometric sensors may include a heart monitor, a blood-pressure monitor, blood-oxygen monitor, a thermistor, etc. The biometric sensor may be configured to monitor the medical conditions of the user/operator of the control system, and facilitate remedial action and delivery of aide to the user in the event that some medical emergency arises. Another example of a modular sensor device is an optical sensor configured to, for example, receive optical data from a direction substantially opposite a side of the control system comprising a display surface. The controller (e.g., the controller 110) may, for example, be configured to determine, based on optical data captured by the optical sensor, whether at least some of the optical data corresponds to features of an eye of the user using the control system. In other words, in this particular example, an optical sensor, implemented as one of the modular devices that can be fitted to the receiving structure of the control system, would collect data from which it can be determined if certain features of the user's face, such as the eye, are visible. This, in turn, would indicate whether the user is viewing a screen, or some other part of the controller. If it is determined that at least some of the optical data captured by the optical sensor corresponds to the features of the eye(s) of the user (e.g., based on image processing applied to the optical data to identify features in the image), the controller may then be configured to control activation state of a display (e.g., an LCD display, a bi-state display, etc.) Conversely, if, based on the optical data, it is determined that the user is not directly viewing the controller 110, the screen/display of the controller 110 may be de-activated (to thus conserve power). The optical data collected by an optical-sensor implemented as one of the sensor-type modular devices of the system 100 may also be used for other purposes (e.g., determine the level of ambient light, which in turn can be used to turn on or off lighting devices of the system or machinery controlled by the control system 100).

Figure 2:
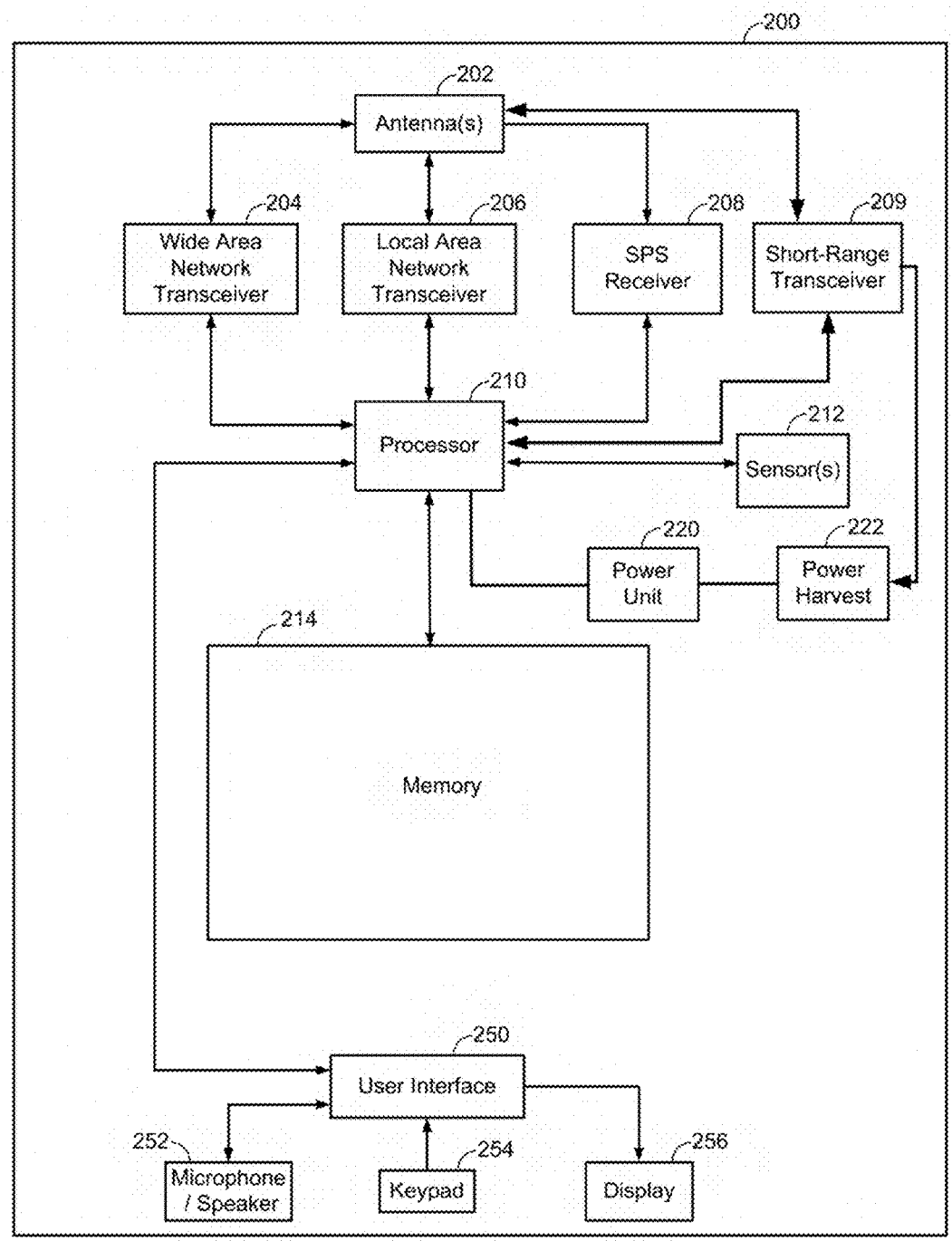
FIG. 2 is a schematic diagram of an example device which may be used to implement a controllers and/or the modular device of FIG. 1.

With reference now to FIG. 2, a schematic diagram of an example device 200, which may be similar to, and be configured to have a functionality similar to that, any of the devices depicted in FIG. 1, including the controller 110 (the tablet-based controller) or 150 (the phone-type controller), and/or the various modular device 130a-e and 160. The example device 200 may also be used to implement any other remote node or device that may be in communication with the controller (control device) 110 and/or 150, or with the modular devices. It is to be noted that one or more of the modules and/or functions illustrated in the example of FIG. 2 may be further subdivided, or two or more of the modules or functions illustrated in FIG. 2 may be combined. Additionally, one or more of the modules or functions illustrated in FIG. 2 may be excluded.

As shown, the example device 200 may include one or more transceivers (e.g., a LAN transceiver 206, a WLAN transceiver 204, a short-range transceiver 209, etc.) that may be connected to one or more antennas 202. The transceivers 204, and 206, and/or 209 may comprise suitable devices, hardware, and/or software for communicating with and/or detecting signals to/from a network or remote devices and/or directly with other wireless devices within a network. In some embodiments, by way of example only, the transceiver 206 may support wireless LAN communication (e.g., WLAN, such as WiFi-based communications) to cause the device 200 to be part of a WLAN implemented as an IEEE 802.11x network. In some embodiments, the transceiver 204 may support the device 200 to communicate with one or more cellular access points (also referred to as a base station) used in implementations of Wide Area Network Wireless Access Points (WAN-WAP), which may be used for wireless voice and/or data communication. A wireless wide area network (WWAN) may be part of a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, a WiMax (IEEE 802.16), and so on. A CDMA network may implement one or more radio access technologies (RATs) such as cdma2000, Wideband-CDMA (W-CDMA), and so on. Cdma2000 includes IS-95, IS-2000, and/or IS-856 standards, and a TDMA network may implement Global System for Mobile Communications (GSM), Digital Advanced Mobile Phone System (D-AMPS), or some other RAT. In some embodiments, 4G networks, Long Term Evolution ("LTE") networks, Advanced LTE networks, Ultra Mobile Broadband (UMB) networks, and all other types of cellular communications networks may also be implemented and used with the systems, methods, and other implementations described herein.

In some implementations, the device 200 may also include the short-range transceiver (interface) 209 configured to allow the device 200 to communicate according to one or more short-range communication protocols, such as, for example, Ultra Wide Band, ZigBee, wireless USB, Bluetooth™ (classical Bluetooth), Bluetooth-Low-Energy™ (BLE) protocol, etc. The transceiver 209 may be implemented using inductive coils to realize short-range inductive communication (which may also be used for inductive power transfer, with the generated inductive field being modulated to allow in-band communication). When the device on which a short-range interface 209 is included is configured to only receive short-range transmissions, the transceiver 209 may be a receiver and may be not capable of transmitting short-range communications.

As further illustrated in FIG. 2, in some embodiments (e.g., in which the example device 200 is used for implementing processor-based controllers with satellite-based positioning functionality), a Satellite Positioning System (SPS) receiver 208 may also be included with the device 200. The SPS receiver 208 may be connected to the one or more antennas 202 for receiving satellite signals. The SPS receiver 208 may comprise any suitable hardware and/or software for receiving and processing SPS signals. The SPS receiver 208 may request information as appropriate from the other systems, and may perform the computations necessary to determine the device's 200 position using, in part, measurements obtained by any suitable SPS procedure. Such positioning information may be used, for example, to determine the location and motion of the lock device, and to control actuation of the lock device. Additionally and/or alternatively, the device 200 may derive positioning information based on signals communicated to and from access points (and/or base stations), e.g., by performing multilateration position determination procedures based on metrics derived from the communicated signals. Such metrics from which the device 200's position may be determined include, for example, timing measurements (using techniques based on round trip time, or RTT, measurements, observed-time-difference-of-arrival, or OTDOA, in which a mobile device measures time differences in received signals from a plurality of network nodes, and so on), signal-strength measurements (e.g., received signal strength indication, or RSSI, measurements, which provide a representation of signal power level of a signal received by an antenna of the mobile device), etc.

As further illustrated in FIG. 2, in some embodiments, one or more sensors 212 may be coupled to a processor 210. The sensors 212 may include sensors that measure and provide data that includes relative movement and/or orientation information (which may be independent of motion data derived from signals received by, for example, the transceivers 204, 206, and/or 209, and the SPS receiver 208). The sensors may include a plurality of different types of devices and combine their outputs in order to provide motion information and information about the environments in which the sensors are located. At least one of the sensors may be a modular device configured to measure data (environmental data) and communicate the data (through wired or wireless communication) to a controller. By way of example but not limitation, sensors 212 may utilize an accelerometer (e.g., a MEMS device), a gyroscope, a geomagnetic sensor (e.g., a compass), and/or any other type of sensor. The one or more sensors 212 may further include an altimeter (e.g., a barometric pressure altimeter), a thermometer (e.g., a thermistor), an audio sensor (e.g., a microphone), etc.

Another type of a sensor/detector that may be included with a controller-based device, and that may be implemented as a modular sensor/detector (for subsequent fitting with a receiving structure of a controller) is a camera or some other type of optical sensors (e.g., a charge-couple device (CCD)-type camera, a CMOS-based image sensor, etc.) Such an optical sensor may be configured to produce still or moving images that may be displayed on a user interface device, and that may be further used to determine an ambient level of illumination and/or information related to colors and existence and levels of UV and/or infra-red illumination, and/or other types of sensors. The optical sensor may be positioned (whether the sensor has been a previously built-in sensor, or has been fitted to the receiving structure forming part of another device's housing) so that its aperture and/or sensor array are directed in a direction opposite that of a display surface of a controller so that the optical sensor (or camera) would receive image/optical data corresponding to the scene viewed from the front of the controller. Thus, in some embodiments, when a user is facing the optical sensor, an image-processing procedure may be applied to images captured by the optical sensor to determine if features of the user (e.g., eyes of the user) are detectable, and, if detectable, to determine if the user is looking at the display or screen of the controller. Such a determination can then be used to control activation of the screen (and thus conserve power) so that the screen or display are activated only when it is determined that the user of a controller (in communication with the optical sensor, which may be a modular sensor or a built-in sensor) is looking at the screen or display.

Additional types of sensors that may be used with the example device 200, or that may be included with a controller implemented based on the example device 200 (e.g., modular devices received by a receiving structure forming part of the housing of such a controller) may include gas detectors/sensors configured to detect the presence of certain substances in the area in which the sensor is located, and/or biometric sensors to measure biometric data relating to a user of the example device 200. Example sensors that may be used (and which may subsequently be fitted into receiving a structure configured to receive modular sensors) include carbon-monoxide sensors, smoke detectors, radio-active detectors, etc. The inclusion of such modular gas sensors (and/or other safety-related devices) can configure the device 200 as an intrinsically-safe device that will inhibit operation of the device 200, and may also inhibit operation of any machine or equipment controlled by the device 200, in response to detection or determination that the device 200 is located in a hazardous, or unsafe, environment.

As noted, any one of the sensors 212 may be implemented as a modular device that includes a housing structured to be fitted or attached to a receiving structure of some master device (e.g., a frame extending from, or forming part of, a housing of a controller that uses the modular sensors). When a sensor is implemented as a modular device, the sensor may include a power source such as a battery, a power conversion unit to receive electrical power through a physical connection (physical interface to physically connect a power port to the controller, and to draw power therefrom), and/or a wireless power receiver that can generate an electric voltage or current from a wireless power field (created by the controller) or from ambient radio-frequency signals received by the wireless power receiver. A modular sensor would generally also include a communication module, which may comprise a physical communication interface for wired communication with the controller, or a wireless communication module to transmit wireless signals to the controller. Communications sent by a modular sensor may include identification information (to identify the sensor sending the data) and the actual data measured by the modular sensor.

In some embodiments, data collected by the various sensors 212 (be it motion data, location data, environmental data, etc.) may be processed by a controller and used to perform control operations. For example, detection of a toxic gas by a gas-sensor (modular, or built-in a controller such as the tablet-based device 110 or the smartphone-based device 150 of FIG. 1) may be used to cause an alert to be displayed on a screen of the controller and/or to cause some control operation to be performed (e.g., de-activate or suspend one or more operations of a machine or system controlled by the controller).

With continued reference to FIG. 2, the device 200 may include a power unit 220 such as a battery and/or a power conversion module that receives and regulates power from an outside source (e.g., AC power, in situations where the device 200 is used to implement a controller, such as the tablet-based controller 110 or the mobile-smartphone-based device 150 of FIG. 1). In some embodiments, e.g., when the device 200 is used to implement a modular device (such as a modular sensor or a modular depressible key), and may not have readily available access to replacement power (e.g., replacement batteries) or AC power, the power source 220 may be connected to a wireless power receiver 222. The wireless power receiver 222 may be configured to inductively generate an electrical voltage or current from a wireless power field generated by a power transmitting device (a transmitter implemented on a controller such as the tablet-based controller 110 or the smartphone-based controller 150 of FIG. 1), or to otherwise harvest energy from received electromagnetic transmissions. Although FIG. 2 illustrates the unit 222 receiving RF communication via the short-range transceiver 209, the power harvest unit 222 may be connected to, and receive RF energy from, any of the other communication interfaces depicted in FIG. 2. A wireless power receiver (or RF harvest unit) generally includes an RF transducer circuit to receive RF transmissions, coupled to an RF-to-DC conversion circuit (e.g., an RF-to-DC rectifier). Resultant DC current may be further conditioned (e.g., through further filtering and/or down-conversion operation to a lower voltage level), and provided to a storage device realized, for example, on the power unit 220 (e.g., capacitor(s), a battery, etc.) In some embodiments, the power unit 220 may generate electrical power based on mechanical actuation. For example, when implementing a depressible-key-type-modular device (such as the devices 130b and 130e of FIG. 1), the power unit 220 may include a piezo-electric element that generates electrical current/voltage when a mechanical key included with the modular device is depressed or otherwise actuated. The electrical energy created may be stored on an electrical energy storage device, and may subsequently be used to cause wireless or wired communication of messages pertaining to the depression of the key (e.g., generate a message that includes identification information to identify the modular device that was actuated, and data regarding the actuation).

Figure 4:
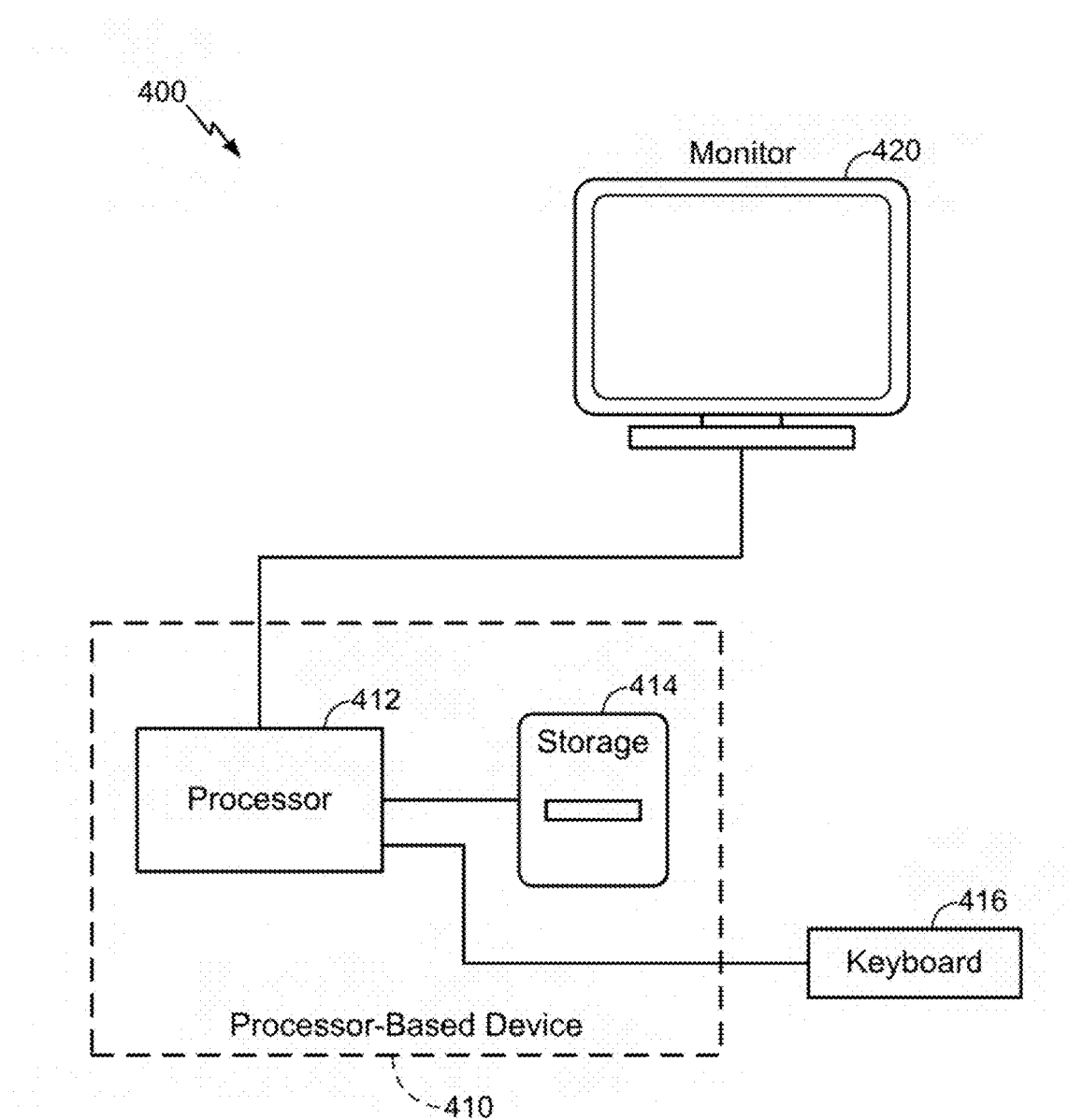
FIG. 4 is a schematic diagram of a processor-based device that may be used to implement, at least partly, some of various devices depicted in FIGS. 1-2.

The processor 210 may be connected to the transceivers 204 and/or 206, the SPS receiver 208 and the sensors 212. The processor may include one or more microprocessors, microcontrollers, and/or digital signal processors that provide processing functions, as well as other calculation and control functionality. The processor 210 may also include memory 214 for storing data and software instructions for executing programmed functionality within the device. The memory 214 may be on-board the processor 210 (e.g., within the same IC package), or may be external memory to the processor and functionally coupled over a data bus. Further details regarding an example embodiments of a processor or computation system, which may be similar to that of the processor 210, are provided below in relation to FIG. 4.

The functionality implemented via software may depend on the particular device at which the memory 214 is housed, and the particular configuration of the device and/or the devices with which it is to communicate. For example, if the device 200 is used to implement a controller/control device (such as the tablet-based controller 110 that may be used to control operation of a system or machinery such as the forklift 140), the device may be configured (via software modules/applications provided on the memory 214) to implement a process to receive signals from one or more modular devices (that may be fitted on a receiving structure or frame coupled to a housing of the controller), identify and/or authenticate the control signals (to determine which modular device sent to the signals), determine and process data included with the received signals (e.g., duration of signals, content of signals, etc.), and cause performance of an operation corresponding to the received signals (e.g., generate control signals to control the system or machinery controlled by the controller). In some implementation, the controller may also be configured to calibrate/set-up/or configure the controller to perform a number of operations responsive to different signals received from different modular devices. Thus, an application running on the controller may be used to pair a particular operation (e.g., generation of a control signal to cause a mechanical output of the system being controlled) to a signal(s) received from a particular modular device. For instance, the application may pair/match a control signal to actuate a mast of a forklift to a signal received from some specific modular device (the modular device may be custom-selected by a user of the controller, according to the particular needs and conveniences of that user). In embodiments in which the device 200 is used to implement a modular device (such as an actuatable user-input device, or a sensor device), the instructions stored on the memory 214 may include instructions to, for example, collect environmental data (if the modular device is a sensor) or record the occurrence of an event (e.g., a key being depressed), and communicate (through a wired or wireless interface) signals representative of the data collected or recorded.

The example device 200 may further include a user interface 250 which provides any suitable interface systems, such as a microphone/speaker 252, a keypad 254, and a display 256, that allow user interaction with the device 200. The user interface 250, be it an audiovisual interface (e.g., a display and speakers), or some other type of interface (visual-only, audio-only, tactile, etc.), is configured to provide status data, alert data, and so on, to a user using the particular device 200. The microphone/speaker 252 provides for voice communication functionality, and the display 256 includes any suitable display, such as, for example, a backlit LCD display, and may further include a touch screen display for additional user input modes. In some embodiments, the display 256 may be a bi-state display configured to maintain (i.e., without requiring on-going supply of energy) the display of particular data (e.g., characters and/or graphics) until the state (i.e., the data) for the bi-state display is changed/updated again. Further details regarding use of a bi-state display for some implementations of the device 200 are provided, for example, in U.S. Pat. No. 8,616,457, entitled "RFID display label for battery packs," the content of which is incorporated herein by reference in its entirety. The microphone/speaker 252 may also include or be coupled to a speech synthesizer (e.g., a text-to-speech module) that can convert text data to audio speech so that the user can receive audio notifications. Such a speech synthesizer may be a separate module, or may be integrally coupled to the microphone/speaker 252 or to the processor 210 of the device of FIG. 2.

The keypad 254 of the device 254 may include suitable buttons for user input, and may, as noted, include modular devices implementing, for example, modular depressible keys selected for inclusion with a controller (implemented according to the example device 200 of FIG. 2) by a user of the controller. When modular user-actuatable keys are included with the device 200, the device 200 may include a housing with a receiving structure (which may comprise at least part of a surface of the display 256) configured to receive the modular user-actuatable keys. The modular keys may be of different shapes and sizes, depending on the particular implementation intended by the user. As noted, a calibration process may initially be run to pair or match actuation of any of the added modular actuatable keys to particular functions or outputs controlled by a controller/control device implemented by the device 200. For example, one actuation profile, which includes a particular duration and/or pattern of actuation, may correspond to one function controlled by the controller (e.g., raising the mast of a forklift can be achieved by one long depression of a particular button), while another actuation profile for the same actuatable key (e.g., longer actuation duration, or some pre-defined actuation pattern) may correspond to a different function or output by the system or machinery controlled by the controller (e.g., lowering the mast can be achieved by two short depression of the particular modular button).

Figure 3:
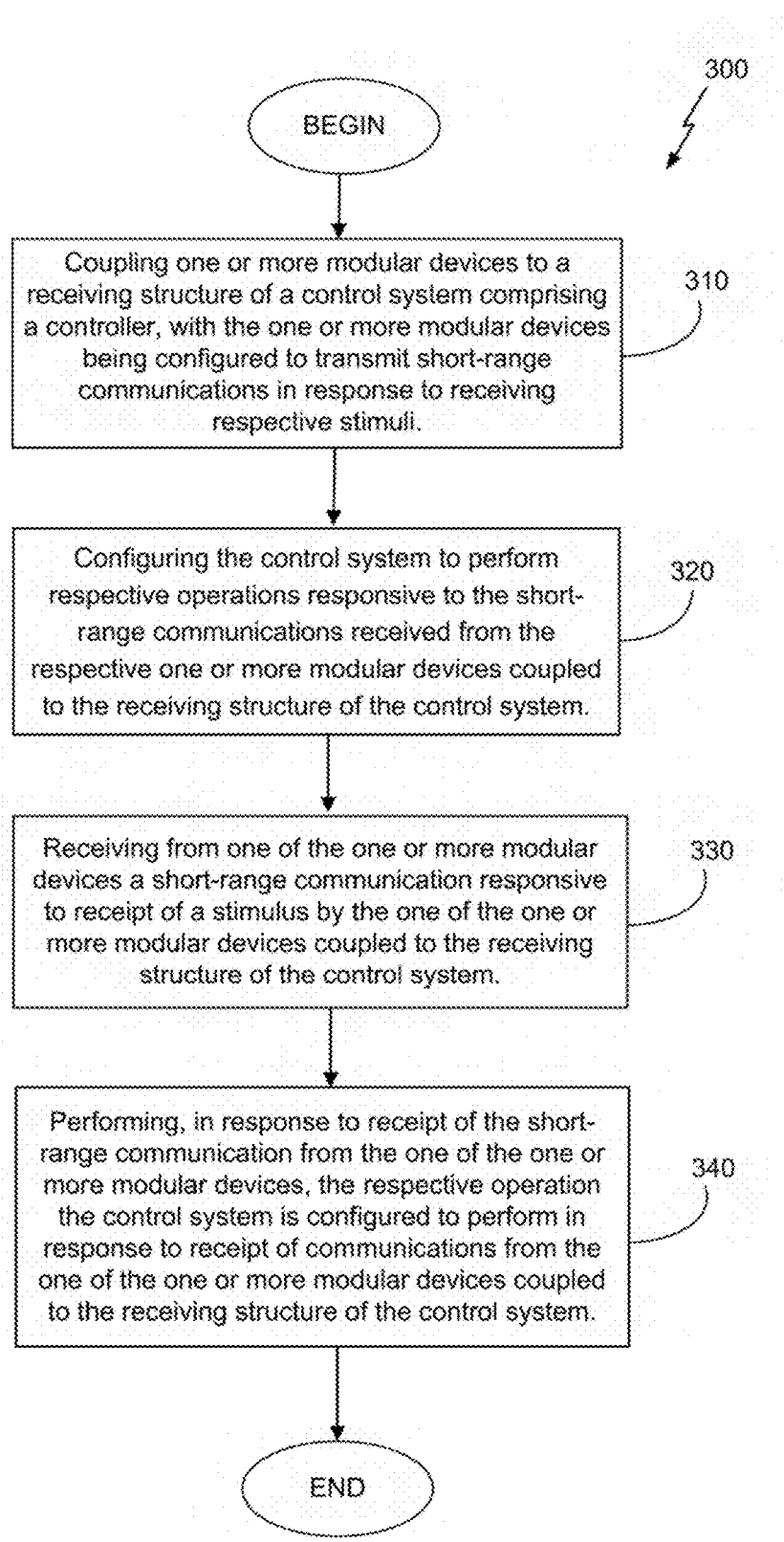
FIG. 3 is a flowchart of an example procedure to control a system or machinery using modular devices in communication with a controller.

With reference now to FIG. 3, a flowchart of an example procedure 300 to control a system or machinery using modular devices in communication with a controller is shown. The procedure 300 includes coupling 310 one or more modular devices to a receiving structure of a control system comprising a controller (e.g., a controller, such as the tablet-based controller 110 or smartphone-based device 150 of FIG. 1). The one or more modular devices may be configured to transmit short-range communications (wired or wireless) in response to receiving respective stimuli. For example, actuation of a depressible modular key may, in some embodiments, cause that modular key to send a transmission (e.g., a wireless transmission which may be according to some standard short-range communication protocols, such as WiFi-, BLE, RDIF, etc., or may be according to some non-standard protocol), and may be performed in any appropriate frequency band (LF, UHF, etc.) The transmission may be powered using electrical energy generated through the actuation action (e.g., using a piezo-electric element included with the modular key). Alternatively, power to generate the transmission, and otherwise perform operations of the modular device, may be provided by an internal battery, a wired connection to a power source (e.g., a battery housed on the controller communicating with the modular devices), RF power harvesting, etc. As discussed, modular devices may also include sensors/detectors configured to collect measurement data, and transmit messages when certain data is determined to have been detected (e.g., the presence of a particular gas, as determined by an appropriate gas sensors). Thus, in some embodiments, coupling the one or more modular devices to the receiving structure of the control system may include one or more of, for example, coupling to the receiving structure at least one modular actuatable button configured to transmit a corresponding short-range communication in response to actuation of the modular actuatable button, and/or coupling to the receiving structure at least one modular sensor configured to measure stimulus data. In some embodiments, coupling to the receiving structure the at least one modular sensor may include coupling to the receiving structure at least one gas sensor configured to detect one or more gases in an area in which the control system is located. As noted, the inclusion of such modular gas sensors (and/or other safety-related devices) can configure the control system to be an intrinsically-safe system that inhibits operation of the control system (and any machinery or equipment controlled by the control system) in response to detection or determination that the control system is located in an unsafe environment.

In some embodiments, coupling the one or more modular device to the receiving structure may include slidably fitting at least one of the one or more modular devices into tracks defined in the receiving structure of the control system, and/or magnetically mounting the at least one of the one or more modular devices to the receiving structure of the control system. Other attachment mechanisms to attach some of the modular devices may also be used. As noted, the receiving structure may include a frame with tracks into which at least part of the housing of the modular devices to be included are fitted. The frame/receiving structure may include grooves and/or latches to securely attach the modular devices to the frame/receiving structure, but the coupling may simply be achieved through tension forces resulting from a snug fit between the portions of the modular devices' housings, and the receiving structure. In some embodiments, one modular device may be a modular optical sensor that may be used to determine, among other things, whether a user using the controller (to control the system or machinery) is looking at the user-interface (e.g., at the screen), and based on that determination, to activate or de-activate the screen/display (thus preserving power). Accordingly, in such embodiments, coupling to the receiving structure the at least one modular sensor may include coupling to the receiving structure at least one optical sensor to receive optical data from a direction opposite a side of the control system comprising a display surface of the control system. In such embodiments, the method may further include determining, based on optical data received from the optical sensor, whether at least some of the optical data corresponds to features of an eye of a user facing the side of the control system comprising the display surface.

With continued reference to FIG. 3, the modular devices coupled to the receiving structure of the controller are next paired or matched to the controller to associate stimuli detected/sensed by those modular devices to operations that are to be performed by the system or machinery controlled by the controller. Thus, the procedure 300 also includes configuring 320 the control system to perform respective operations responsive to the short-range communications received from the respective one or more modular devices coupled to the receiving structure of the control system. Configuring the control system (i.e., calibrating the controller to set up which control signals to generate in response particular stimuli data received from the modular devices) may be performed through an initial set-up application in which one or more operations of the system or machinery being controlled are matched to respective data (e.g., data including an identifier associated with one of the modular device, and stimuli data from that modular device) so that, in response to the controller receiving that particular data, the controller generates the appropriate control signaling (e.g., electrical signals, command data such as API calls, etc.) to cause the system or machinery in question to perform the appropriate operations. Thus, in some embodiments, configuring the control system to perform the respective operations responsive to the communications received from the respective one or more modular devices (coupled to the receiving structure of the control system) may include selecting one of a plurality of operations performable by the control system, and assigning the selected one of the plurality of operations to be associated with communication received from a selected one of the one or more modular devices coupled to the receiving structure of the control system. When pairing a particular operation of the control system to a particular modular device, an identifier associated with the modular device may first be obtained. This identifier may be stored within a non-volatile memory module of the modular device (and as such may be a modifiable identifier), and may be provided to the controller performing the calibration procedure through a short-range communication. Alternatively, a user may provide the identifier to the controller by manually providing it through some user interface (e.g., via a keypad, via an optical scanner to scan a barcode provided on the particular modular device, etc.)

As further illustrated in FIG. 3, the procedure 300 additionally includes receiving 330 from one of the one or more modular devices a short-range communication responsive to receipt of a stimulus by the one of the one or more modular devices coupled to the receiving structure of the control system. The short range communication may include wired communication, in which case the modular device may include a wired interface (such as the interfaces 132a-c of the modular device 130c), or may include wireless communication, which may be based on standard communication protocols, or non-standard protocols. For example, one modular device may be configured to generate, through a coil-based antenna, a magnetic field to cause inductive voltage or current at a receiving antenna (coil-based antenna) on the controller. The magnetic field may be modulated to cause varying levels of electrical voltage or current at the receiving antenna, with the varying voltage/current levels being used to represent the data being communicated to the controller according to some private or standard protocol. In some implementations, different modular devices may communicate with the controller according to different communication protocols. For example, one modular device may communicate according to a BLE™ protocol (causing transmissions of BLE iBeacon advertisements), another coupled modular device may communicate according to a WiFi protocol, and yet another modular device may communicate according to a private (customized) protocol. A short-range communication sent from a modular device (be it an actuatable modular key device, a modular sensor device, or otherwise) may include an identifier associated with the modular device, and data representative of the stimulus detected by the modular device. If the modular device is an actuatable modular key, the stimuli data may include data indicating that the key was depressed (in some embodiments, the transmission itself may constitute an indication that the modular key was depressed), the duration of the actuation (e.g., how long was the depressible key was held down), the actuation pattern (how many key strokes were recorded during some time interval), and other germane data. If the modular device is a modular sensor, the stimuli data may include the value of the property measured by the sensor, e.g., image data (if the sensor as an optical or image-capture sensor), gas level data, motion data, etc. Thus, in some embodiments, receiving from the one of the one or more modular devices the short-range communication responsive to receipt of the stimulus by the one of the one or more modular devices coupled to the receiving structure of the control system may include receiving an identifier associated with the one of the one or more modular devices, and stimulus data representative of the respective stimulus received by the one of the one or more modular devices, with the identifier and the stimulus data included with the short-range communication received by the control system, and determining the identifier associated with the one or more of the plurality of modular devices.

The procedure 300 further includes performing 340, in response to receipt of the short-range communication from the one of the one or more modular devices, the respective operation the control system is configured to perform in response to receipt of communications from the one of the one or more modular devices coupled to the receiving structure of the control system.

Performing the various operations described herein may be facilitated by a processor-based computing system. Particularly, each of the various systems/devices described herein (including a controller/control device, such as the tablet-based controller 110 or the phone-based controller 150 of FIG. 1, and any of the modular devices that includes a local controller to facilitate the measurement/detection/actuation operations performed by such modular devices) may be implemented, at least in part, using one or more processing-based devices such as a computing system. Thus, with reference to FIG. 4, a schematic diagram of a computing system 400 is shown. The computing system 400 includes a processor-based device 410 such as a personal computer, a specialized computing device, and so forth, that typically includes a central processor unit 412. In addition to the CPU 412, the system includes main memory, cache memory and bus interface circuits (not shown). The processor-based device 410 may include a mass storage element 414, such as a hard drive or flash drive associated with the computer system. The computing system 400 may further include a keyboard 416 (which may include one or more modular keys), or some other user input interface, and a monitor 420, e.g., a CRT (cathode ray tube) or LCD (liquid crystal display) monitor, that may be placed where a user can access them.

The processor-based device 410 is configured to facilitate, for example, the implementation of operations to generate and/or receive communications from modular devices (modular sensors, modular actuatable keys, etc.), perform control operations in response to those communications, etc. The storage device 414 may thus include a computer program product that when executed on the processor-based device 410 causes the processor-based device to perform operations to facilitate the implementation of the above-described procedures and operations. The processor-based device may further include peripheral devices to allow input/output functionality. Such peripheral devices may include, for example, a CD-ROM drive and/or flash drive (e.g., a removable flash drive), or a network connection (e.g., implemented using a USB port and/or a wireless transceiver), for downloading related content to the connected system. Such peripheral devices may also be used for downloading software containing computer instructions to enable general operation of the respective system/device. Alternatively and/or additionally, in some embodiments, special purpose logic circuitry, e.g., an FPGA (field programmable gate array), an ASIC (application-specific integrated circuit), a DSP processor, etc., may be used in the implementation of the system 400. Other modules that may be included with the processor-based device 410 are speakers, a sound card, a pointing device, e.g., a mouse or a trackball, by which the user can provide input to the computing system 400. The processor-based device 410 may include an operating system, e.g., Windows XP® Microsoft Corporation operating system. Alternatively, other operating systems could be used.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, Programmable Logic Devices (PLDs)) used to provide machine instructions and/or data to a programmable processor, including a non-transitory machine-readable medium that receives machine instructions as a machine-readable signal.

Some or all of the subject matter described herein may be implemented in a computing system that includes a back-end component (e.g., as a data server), or that includes a middleware component (e.g., an application server), or that includes a front-end component (e.g., a client computer having a graphical user interface or a Web browser through which a user may interact with an embodiment of the subject matter described herein), or any combination of such back-end, middleware, or front-end components. The components of the system may be interconnected by any form or medium of digital data communication (e.g., a communication network). Examples of communication networks include a local area network ("LAN"), a wide area network ("WAN"), and the Internet.

The computing system may include clients and servers. A client and server are generally remote from each other and typically interact through a communication network. The relationship of client and server generally arises by virtue of computer programs running on the respective computers and having a client-server relationship to each other.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the embodiments and features disclosed herein. Other unclaimed embodiments and features are also contemplated. Accordingly, other embodiments are within the scope of the following claims.

What is claimed is:

1. A control system comprising:
    a receiving structure to receive a plurality of modular stimulus detection devices;
    one or more of the plurality of modular stimulus detection devices coupled into respective locations on the receiving structure, each of the one or more of the plurality of modular stimulus detection devices configured to transmit a short-range communication in response to receiving a respective stimulus by the each of the one or more of the plurality of modular stimulus detection devices;
    a communication module to communicate with the one or more of the plurality of modular stimulus detection devices coupled to the receiving structure; and
    a controller, placed in a controller housing coupled to the receiving structure, configured to cause respective one or more modifiable operations to be performed by a machine located remotely from the controller housing, in response to receiving a short-range message from a respective one of the one or more of the plurality of modular stimulus detection devices, received in the receiving structure, the respective one or more modifiable operations being selected during calibration procedures such that the controller is adapted to cause a first sequence of actions to be performed by the machine in response to a particular stimulus from a particular modular stimulus detection device, from the one of the one or more of the plurality of modular stimulus detection devices, when a first calibration operation is performed for the controller, and to cause a second, different, sequence of actions to be performed by the machine, responsive to the particular stimulus from the particular modular stimulus detection device, when another, subsequent, calibration procedure is performed on the controller;
    wherein at least one of the one or more of the plurality of modular stimulus detection devices comprises at least one sensor configured to measure stimulus data, and wherein the at least one sensor comprises one or more of:
        i) an optical sensor to capture optical data from a direction opposite a side of the control system comprising a display surface, wherein the controller is configured to determine, based on the optical data captured by the optical sensor, whether at least some of the optical data corresponds to features of an eye of a user facing the side of the control system comprising the display surface, or
        ii) a biometric sensor to measure biometric data for the user of the control system.

2. The control system of claim 1, wherein the short-range message transmitted by a respective one of the one or more of the plurality of modular stimulus detection devices includes an identifier associated with the respective one of the one or more of the plurality of modular stimulus detection devices, and stimulus data representative of the respective stimulus received by the respective one of the one or more of the plurality of the modular stimulus detection devices, and wherein the controller is configured to identify the identifier associated with the respective one of the one or more of the plurality of modular stimulus detection devices.

3. The control system of claim 1, wherein at least one of the one or more of the plurality of modular stimulus detection devices comprises an energy harvesting module including at least one of: an inductive power-harvesting unit, or a piezo-electric-based energy harvesting unit.

4. The control system of claim 1, wherein the each of the one or more of the plurality of modular stimulus detection devices configured to transmit the short-range communication is configured to transmit one or more of: an inductive-based electromagnetic transmission, an RFID-based transmission, a Bluetooth transmission, a Bluetooth-Low-Energy transmission, or a WiFi transmission.

5. The control system of claim 1, wherein at least one of the one or more of the plurality of modular stimulus detection devices is mechanically slidable into tracks defined in the receiving structure of the control system.

6. The control system of claim 1, wherein at least one of the one or more of the plurality of modular stimulus detection devices is magnetically mountable to the receiving structure of the control system.

7. The control system of claim 1, wherein at least one of the one or more of the plurality of modular stimulus detection devices comprises an actuatable keyboard button configured to transmit a corresponding short-range communication in response to actuation of the actuatable keyboard button.

8. The control system of claim 1, wherein the at least one sensor comprises a gas sensor configured to detect one or more gases in an area in which the control system is located.

9. The control system of claim 1, wherein the controller is configured to control activation state of the display surface of the control system based on a determination of whether the at least some of the optical data captured by the optical sensor corresponds to the features of the eye of the user using the control system.

10. The control system of claim 1, wherein the controller is configured to control operation of the control system based, at least in part, on the measured biometric data for the user.

11. The control system of claim 1, wherein the particular modular stimulus detection devices comprises an energy harvesting module to provide power to generate a corresponding short-range message transmitted to the controller, the energy harvesting module including at least one of: an inductive power-harvesting unit, or a piezo-electric-based energy harvesting unit.

12. A method comprising:
    coupling one or more modular stimulus detection devices to a receiving structure of a control system comprising a controller, wherein the one or more modular stimulus detection devices are configured to transmit short-range communications in response to receiving respective stimuli;
    configuring the controller, placed in a controller housing coupled to the receiving structure, to cause respective one or more modifiable operations to be performed by a machine located remotely from the controller housing, responsive to the short-range communications received from the respective one or more modular stimulus detection devices coupled to the receiving structure of the control system;

receiving from one of the one or more modular stimulus detection devices a short-range communication responsive to receipt of a stimulus by the one of the one or more modular stimulus detection devices coupled to the receiving structure of the control system; and causing, in response to receipt of the short-range communication from the one of the one or more modular stimulus detection devices, a respective modifiable operation to be performed by the machine in response to receipt of communications from the one of the one or more modular stimulus detection devices coupled to the receiving structure of the control system, wherein causing the respective modifiable operation comprises causing a first sequence of actions to be performed by the machine in response to a particular stimulus from the one of the one or more modular stimulus detection devices when the controller is calibrated according to a first calibration operation, and causing a second, different, sequence of actions, responsive to the particular stimulus from the one of the one or more modular stimulus detection devices when the controller is calibrated according to a second calibration procedure;

wherein at least one of the one or more modular stimulus detection devices comprises at least one modular sensor configured to measure stimulus data, and wherein the at least one modular sensor comprises one or more of:
  i) an optical sensor to capture optical data from a direction opposite a side of the control system comprising a display surface, wherein the controller is configured to determine, based on the optical data captured by the optical sensor, whether at least some of the optical data corresponds to features of an eye of a user facing the side of the control system comprising the display surface, or
  ii) a biometric sensor to measure biometric data for the user of the control system.

13. The method of claim 12, wherein coupling the one or more modular stimulus detection devices to the receiving structure comprises:
  slidably fitting at least one of the one or more modular stimulus detection devices into tracks defined in the receiving structure of the control system; or
  magnetically mounting the at least one of the one or more modular stimulus detection devices to the receiving structure of the control system.

14. The method of claim 12, wherein receiving from the one of the one or more modular stimulus detection devices the short-range communication responsive to receipt of the stimulus by the one of the one or more modular stimulus detection devices coupled to the receiving structure of the control system comprises:
  receiving an identifier associated with the one of the one or more modular stimulus detection devices, and stimulus data representative of the respective stimulus received by the one of the one or more modular stimulus detection devices, the identifier and the stimulus data included with the short-range communication received by the control system; and
  determining the identifier associated with the one or more of the plurality of modular stimulus detection devices.

15. The method of claim 12, wherein the one or more modular stimulus detection devices comprise:
  at least one modular actuatable button configured to transmit a corresponding short-range communication in response to actuation of the at least one modular actuatable button.

16. The method of claim 12, wherein the at least one modular sensor comprises:
  at least one gas sensor configured to detect one or more gases in an area in which the control system is located.

17. The method of claim 12, further comprising:
  controlling activation state of the display surface of the control system based on a determination of whether the at least some of the optical data captured by the optical sensor corresponds to the features of the eye of the user using the control system.

18. The method of claim 12, wherein configuring the control system to perform the respective operations responsive to the communications received from the respective one or more modular stimulus detection devices coupled to the receiving structure of the control system comprises:
  selecting one of a plurality of operations performable by the control system; and
  assigning the selected one of the plurality of operations to be associated with communications received from a selected one of the one or more modular stimulus detection devices coupled to the receiving structure of the control system.

19. A modular device comprising:
  a housing fittable on a receiving structure coupled to a controller housing, containing a controller of a control system, configured to receive a plurality of modular stimulus detection devices;
  a detector configured to receive a stimulus; and
  a communication module to transmit a short-range message to the controller in response to receiving the stimulus, wherein the controller is adapted to cause a configurable one or more modifiable operations to be performed by a machine located remotely from the controller housing in response to receiving the short-range message from the modular device, wherein the respective one or more modifiable operations are selected during calibration procedures such that the controller is adapted to cause a first sequence of actions to be performed by the machine in response to a particular stimulus from the modular device when a first calibration operation is performed for the controller, and to cause a second, different, sequence of actions to be performed by the machine, responsive to the particular stimulus from the modular device when another, subsequent, calibration procedure is performed on the controller;
  wherein the detector comprises one or more of:
    i) an optical sensor to capture optical data from a direction opposite a side of the control system comprising a display surface, wherein the controller is configured to determine, based on the optical data captured by the optical sensor, whether at least some of the optical data corresponds to features of an eye of a user facing the side of the control system comprising the display surface, or
    ii) a biometric sensor to measure biometric data for the user of the control system.

* * * * *